(12) United States Patent
Vook et al.

(10) Patent No.: US 7,411,437 B2
(45) Date of Patent: Aug. 12, 2008

(54) TRIGGERING EVENTS AT FRACTIONS OF A CLOCK CYCLE

(75) Inventors: Dietrich Werner Vook, Los Altos, CA (US); Vamsi Krishna Srikantam, Fremont, CA (US); Andrew Fernandez, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/292,477

(22) Filed: Dec. 2, 2005

(65) Prior Publication Data

US 2007/0126488 A1  Jun. 7, 2007

(51) Int. Cl.
G06F 1/04 (2006.01)
(52) U.S. Cl. .................. 327/291; 327/269; 327/296; 327/295
(58) Field of Classification Search .................. None
See application file for complete search history.

(56) References Cited

U.S. PATENT DOCUMENTS

| | | | |
|---|---|---|---|
| 3,189,838 A | 6/1965 | Marsh, Jr. | |
| 3,675,133 A | 7/1972 | Frankeney et al. | |
| 4,825,109 A | 4/1989 | Reynolds | |
| 5,150,364 A * | 9/1992 | Negus | 370/542 |
| 5,886,552 A * | 3/1999 | Chai et al. | 327/165 |
| 6,127,864 A * | 10/2000 | Mavis et al. | 327/144 |
| 6,175,603 B1 * | 1/2001 | Chapman et al. | 375/354 |
| 6,614,314 B2 * | 9/2003 | d'Haene et al. | 331/1 A |
| 6,819,153 B2 * | 11/2004 | Sonobe | 327/158 |

FOREIGN PATENT DOCUMENTS

GB  2398193  8/2004

OTHER PUBLICATIONS

European Patent Office, European Search Report, Apr. 11, 2007.

* cited by examiner

*Primary Examiner*—N. Drew Richards
*Assistant Examiner*—An T. Luu

(57) ABSTRACT

Generally, the embodiments presented are directed to circuits and methods for triggering an event at a fraction of a clock cycle. A triggering circuit can comprise two or more input circuits that output an event signal. The event signal is received by one of two or more delay circuits that trigger the event signal at a predetermined phase of the clock cycle by moving the event signal from a first clock domain to another clock domain. By triggering the event at a phase division, the triggering circuit outputs signals at a rate faster than the clock cycle.

19 Claims, 7 Drawing Sheets

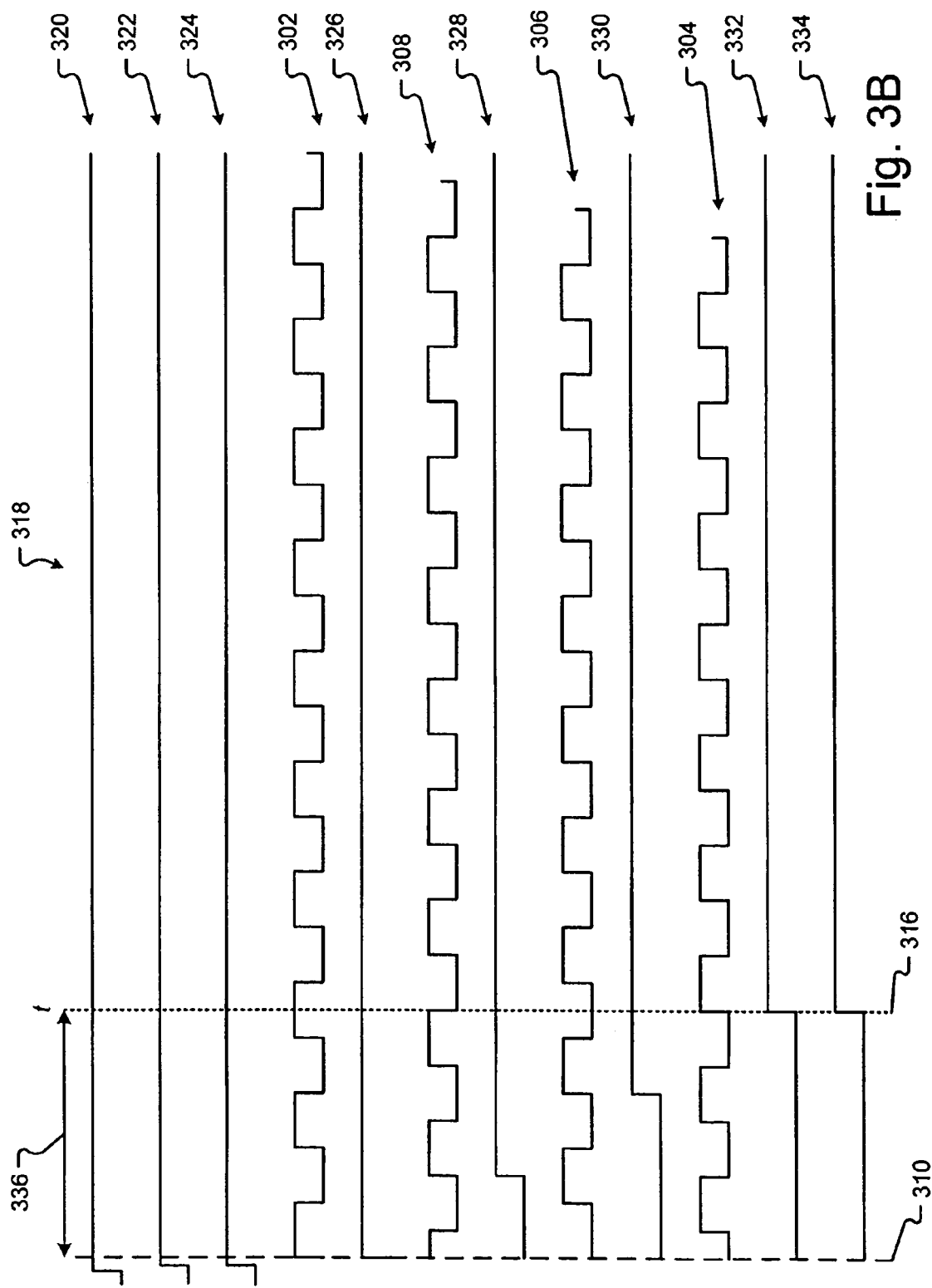

TRIGGERING EVENTS AT FRACTIONS OF A CLOCK CYCLE

BACKGROUND

In many electronic devices, logic functions are often performed by an integrated circuit specially designed and made for the particular device. Generally there are two types of custom integrated circuits, an Application Specific Integrated Circuit (ASIC) or a Field Programmable Gate Array (FPGA). ASICs provide a generally fast processor with clock speeds that may exceed 1 GHz. Unfortunately, ASICs and the engineering effort required to design and produce the ASIC can be cost prohibitive.

Designers often use FPGAs to reduce the cost of electronic devices. However, FPGAs operate at 500 MHz, which is much slower than ASICs, and do not work well in applications that require the higher clock speeds of ASICs.

SUMMARY

In general terms, this document is directed to circuits and methods for triggering an event at a fraction of a clock cycle.

One aspect is a triggering circuit comprising two or more input circuits. Each input circuit is arranged to receive an input signal, and one of the input circuits receives a phase selection signal and outputs an event signal in response to receiving the input signal. Two or more delay circuits are in electrical communication with an input circuit. One delay circuit receives the event signal and is configured to trigger the event signal at a predetermined phase of a clock cycle.

Another aspect is a triggering circuit comprising a delay circuit having two or more delay elements arranged such that each delay element receives an input signal and outputs an event signal at a predetermined phase of a clock cycle. A selection circuit is in electrical communication with each delay element such that the selection circuit selects which event signal from which delay element is output.

Yet another aspect is a method for triggering an event signal at a predetermined time comprising: receiving an input signal; receiving a phase selection signal; generating an event signal in response to the phase selection signal and the input signal; and triggering the event signal at a predetermined phase of a clock cycle.

BRIEF DESCRIPTION OF THE DRAWINGS

FIG. 3A and FIG. 3B are timing diagrams of sample waveforms related to the triggering circuit in FIG. 2 and illustrating the delay of an event trigger.

DETAILED DESCRIPTION

Figure 1:
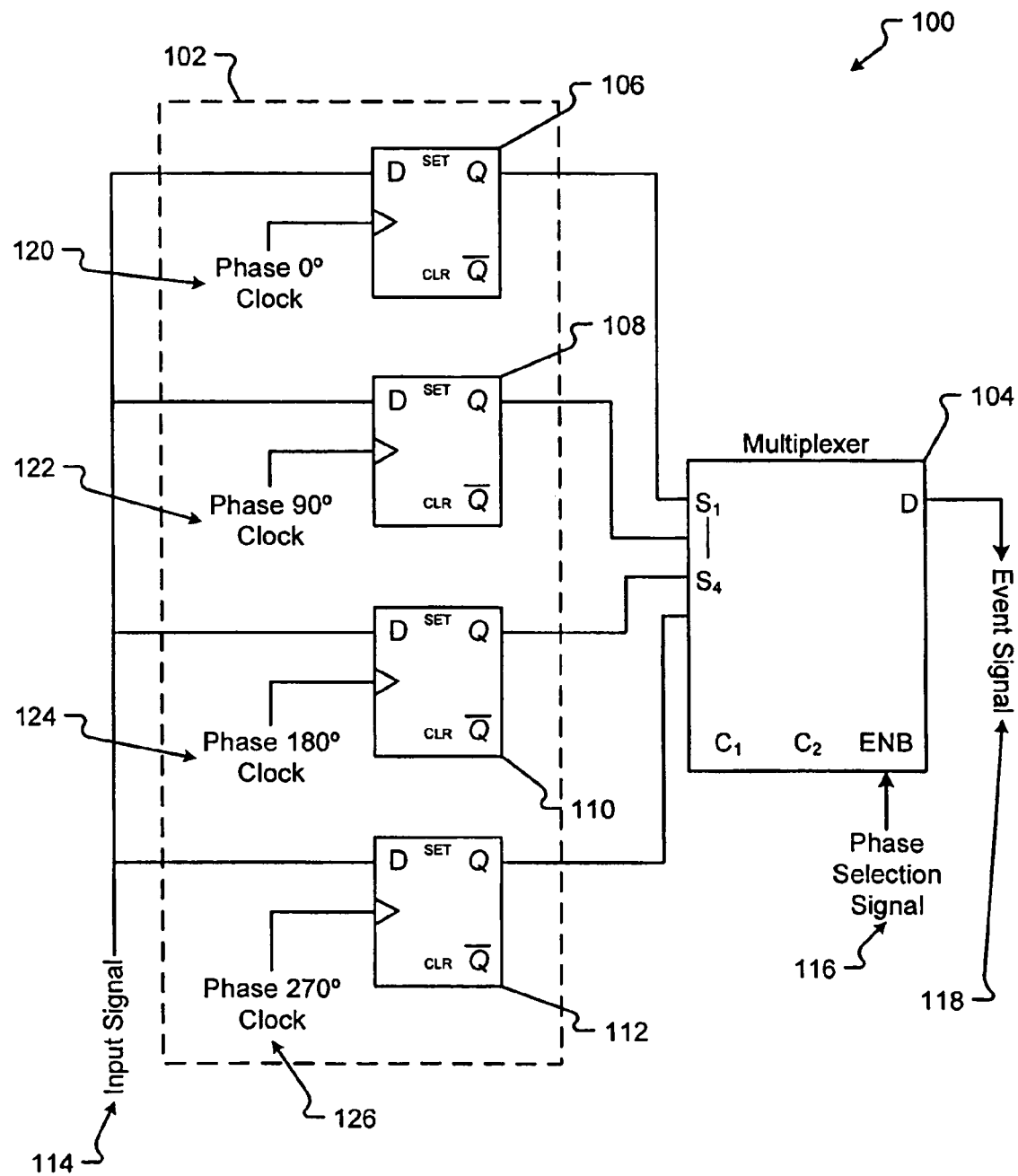
FIG. 1 is a schematic diagram of an embodiment of a digital triggering circuit.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In the exemplary embodiment, a triggering circuit delays the trigger of an event to a fraction of a clock cycle. The triggering circuit outputs an event signal at a predetermined phase of the clock, which is a fraction of the whole clock cycle. The clock cycle is divided into two or more phases, such that the triggering circuit is provided two or more clock signals, each clock signal having a different, predetermined phase. An event can be triggered using one of the several clock signals having a predetermined phase. In one exemplary embodiment, an input signal is sent to at least one delay circuit that may contain one or more delay elements. The delay circuit outputs an event signal at a predetermined phase of the clock. Further, a phase selection signal may select which event signal from which delay circuit is output from the triggering circuit.

An exemplary embodiment of a triggering circuit 100 is shown in FIG. 1. The triggering circuit 100 comprises a delay circuit 102 and a selection circuit 104. The delay circuit 102 includes four delay elements 106, 108, 110, and/or 112. The delay circuit may have two or more delay elements. The delay elements are flip-flops or may also be latches, other circuits, or other electronic elements capable of performing the functions of a delay element as described herein. Each delay element receives an input signal 114. In the exemplary embodiment, the input signal 114 is input as data into a flip-flop. The input signal 114, like the other signals described herein, is a digital signal, which has two states, a low state, represented digitally as a zero, and a high state, represented digitally as a one. The low state and high state may be any voltage as required to cause an output by the flip-flop or other type of delay element or cause some operation to be performed by a circuit or other electrical element.

Two or more clock signals with predetermined phases are input into the triggering circuit 100. For example, current FPGAs known in the art, such as the Xilinx® Virtex™ family of FPGAs, include a clock manager circuit that can produce two or more clocks having different phases. A clock signal has a different phase if its rising edge occurs at a different time than a reference clock, such as a clock 0° signal. Each delay element 106, 108, 110, and 112 in the delay circuit 102 receives a clock of a predetermined phase, such as clock signals 120, 122, 124, and 126. For example, delay element 106 receives a phase 0° clock signal 120 while delay element 108 receives a phase 90° clock signal 122.

The phases used for the clocks can have any phase division, but, in the exemplary embodiment in FIG. 1, has uniform or equal phase divisions of the 360° phase space, for example, four uniform or equal phase divisions of 0°, 90°, 180°, and 270°. Other phase divisions are possible, for example, eight equal or uniform phase divisions of 0°, 45°, 90°, 135°, 180°, 225°, 270°, and 315°. The phase divisions are uniform because the phase divisions are equally spaced throughout the phase space of 360°, e.g. phase 45° is 45° from phase 0°, phase 90° is 45° from phase 45°, etc.

In other embodiments, the phase divisions may be non-uniform. Non-uniform phase divisions include at least a first set of phase divisions having a first amount of separation in a first part of the phase space while a second set of phase divisions has a second amount of separation in a second part of the phase space. For example, the phase division from phase 315° to phase 45° may be separated by 15°. In contrast, the phase divisions between phase 45° and phase 315° may be separated by 45°. The entire 360° phase space would have phase divisions 0°, 15°, 30°, 45°, 90°, 135°, 180°, 225°, 270°, 315°, 330°, 345°. Non-uniform phase divisions provide better granularity or accuracy for triggering events near a certain phase. Thus, the triggering circuit with non-uniform phase divisions can trigger events in cases where the event edges need to be closer to a particular phase (e.g., phase 0°), while in the triggering circuit with uniform phase divisions, the entire phase space (0°-360° deg) is covered uniformly.

Each delay element 106, 108, 110, and 112 outputs an event signal at a predetermined phase. After the rising edge of one of the clocks having predetermined phases, the delay element 106, 108, 110, and/or 112 outputs an event signal. For example, After the rising edge of the phase 0° clock, delay element 106 outputs an event signal. After the rising edge of the phase 270° clock, delay element 112 outputs an event signal. Each delay element 106, 108, 110, and 112 thus outputs an event signal at a different, predetermined time because each input clock has a rising edge that occurs at a different phase. In addition, it should be noted that by triggering events to phases of the clock, the delay circuit 102 can generate event signals at less than the full clock cycle, i.e., the delay circuit can generate event signals at fractions of the clock cycle. The delay elements, by outputting event signals at different phases of the clock cycle can output events at fractions of a clock cycle. Any signals output or triggered by a clock having a certain, predetermined phase, e.g., the phase 0° clock, is in that clock's domain, e.g., the phase 0° clock domain. If a signal in one clock domain, e.g., the phase 0° clock domain, is output or triggered by a clock having a different phase, e.g., a phase 270° clock, then the event signal is placed or moved into that clocks domain, e.g., the phase 270° clock domain.

The event signals are sent to a selection circuit 104 that is in electrical communication with each of the delay elements 106, 108, 110, and 112. In the exemplary embodiment, the selection circuit 104 is a multiplexer that will output a certain input in response to a selection signal. Four signals from the four delay elements 106, 108, 110, and 112 are received at the selection circuit 104. A phase selection signal 116 selects which input should be output as the event signal 118. For example, the phase selection signal 116 may select the event signal from the delay element 108 that outputs the event signal at phase 90°. The selection circuit 104 responds to the phase selection signal 116 such that when the event signal is output from the delay element 108 in input into the selection circuit 104, the event signal is passed through the selection circuit 104 and output from the triggering circuit 100. In this way, one selection circuit 104 allows an event signal from any of two or more of delay elements to be output from the triggering circuit 100.

Figure 2:
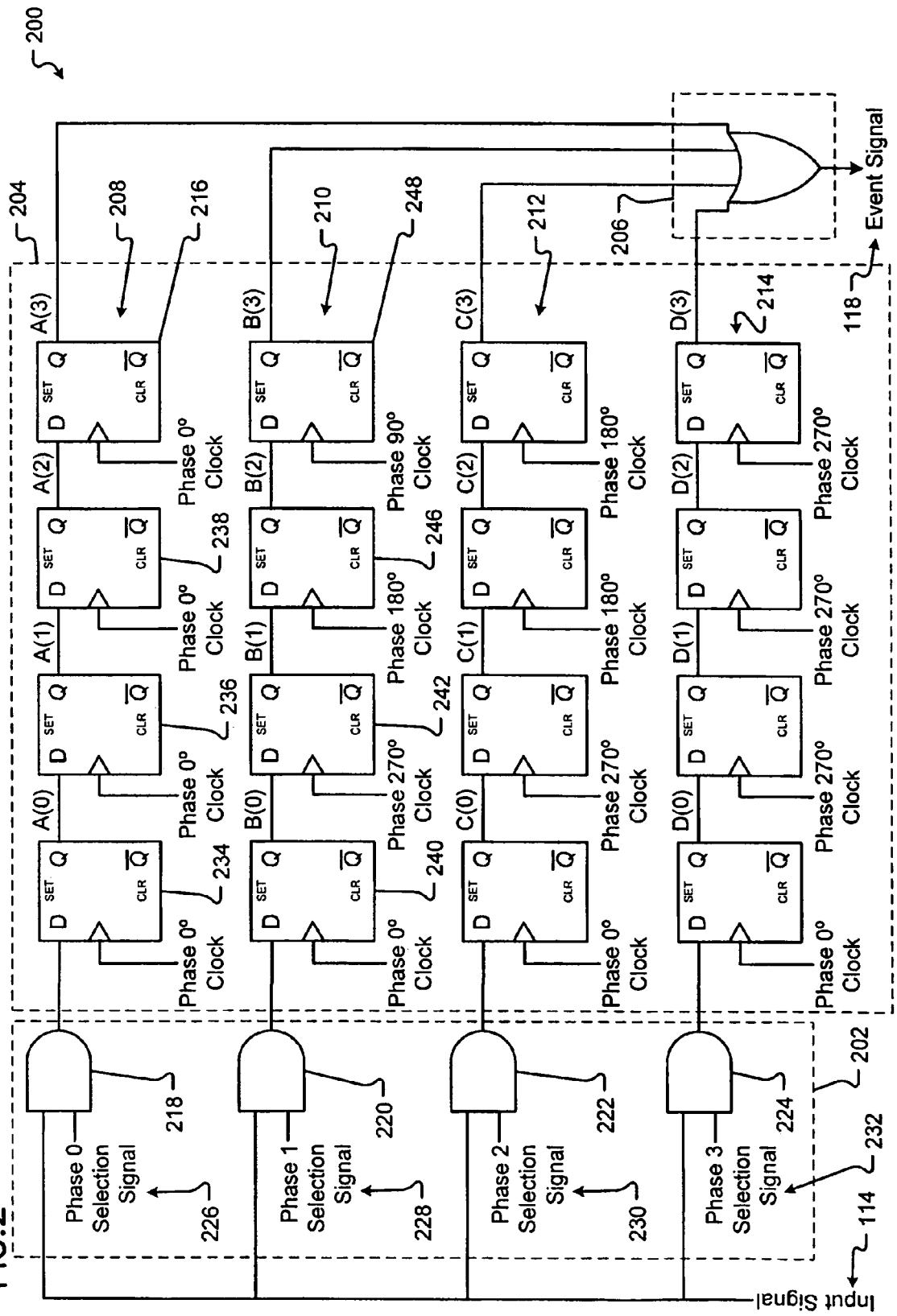
FIG. 2 is a schematic diagram of another exemplary embodiment of a digital triggering circuit.

Another exemplary embodiment of a triggering circuit 200 is shown in FIG. 2. The triggering circuit 200 comprises two or more input circuits 202 and two or more delay circuits 204. In the exemplary embodiment, the input circuits 202 are AND gates. Each input circuit 218, 220, 222, and 224 is arranged to receive an input signal 114 and one of two or more selection signals 226, 228, 230, or 232, but only one input circuit receives a selection signal at any one time. The input circuit that receives the selection signal outputs an event signal to one of the two or more delay circuits 204 that are in electrical communication with the input circuits 202. For example, if input circuit 220 receives the input signal 114 and selection signal 228, then only input circuit 220 outputs an event signal to delay circuit 210.

The delay circuits 204 can each include two or more delay elements, such as delay element 216 of delay circuit 208. In the exemplary embodiment, the delay elements are flip-flops, although the delay elements may also be latches, other circuits, or other electronic elements capable of performing the functions of a delay element as described herein. Each delay element receives an event signal. The first delay element in the delay circuit receives the event signal from the input circuit and then relays the event signal to two or more other delay elements. For example, the first delay element 234 in delay circuit 208 may receive the event signal from input circuit 218. Delay element 234 then relays the event signal A(0) to delay element 236, which relays the event signal A(1) to delay element 238, which relays the event signal A(2) to delay element 216.

In the exemplary embodiment, each delay element receives a clock having a predetermined phase; the received clock may have the same or different phase than the clock received by one or more other delay elements in a delay circuit. The clock input into each delay element causes the delay element to trigger or relay the event signal at the predetermined phase. By changing the clock input(s), the delay circuit changes when an event signal is output from the delay circuit. For example, delay circuit 208 inputs only the phase 0° clock into each delay element 234, 236, 238, and 220. As such, each delay element 234, 236, 238, 220 triggers the event signal at approximately of or after the rising edge of the phase 0° clock. If the clock period or clock cycle is 4 ns, the total delay across delay circuit 208 is 12 ns. In contrast, delay circuit 210 inputs a different phase clock into each delay element 240, 242, 246, and 248 in the delay circuit 210. The phase 270° clock causes the delay element 242 to output the event signal B(1) to delay element 246 only 3 ns after receiving the event signal B(0) from delay element 240. The 3 ns delay is created because the rising edge of the phase 270° clock occurs only 3 ns after the rising edge of the phase 0° clock. In similar fashion, delay element 246 outputs the event signal B(2) 3 ns after receiving the event signal B(1) from delay element 242, and delay element 248 outputs the event signal B(3) 3 ns after receiving the event signal B(2) from delay element 246. By triggering each flip-flop with a clock having a predetermined phase the delay circuit 212 provides a delay between the generation of a first event signal D(0) from a first delay element 238 and the generation of a second event signal D(1) from a second delay element 240. The delay between the delay elements 238 and 240 allows enough time for any setup times, hold times, and or propagation delays. All other delay circuits provide similar delays between the triggering of one delay element and another delay element. The total delay over delay circuit 210 is 9 ns. The other delay circuits 212 and 214 operate similarly. Assuming a 4 ns clock cycle, delay circuit 212 provides a total delay of 10 ns and delay circuit 214 provides a total delay of 11 ns.

The delay circuits 204 provide a means for delay the triggering of an event signal to fractions of the clock cycle. By delaying when the event signal will be output, each of the delay circuits cause the event signal to be output at a predetermined phase of the clock cycle. For example, delay circuit 208 causes the event signal to be output at phase 0° of the clock, delay circuit 210 causes the event signal to be output at phase 90° of the clock, delay circuit 212 causes the event signal to be output at phase 180° of the clock, and delay circuit 214 causes the event signal to be output at phase 270° of the clock. To output the event signal at the fraction of the clock cycle and at a predetermined time, the input signal and phase selection signal need be input some time, approximately equal to the predetermined delay, ahead of the desired output time. For example, to have an output signal output at phase 90° of the clock, the input signal and the phase selection signal need to be received at input circuit 220 approximately 9 ns or more before the output signal should be triggered from the triggering circuit 200.

The first delay element in each delay circuit receives an input clock having the same, predetermined phase. e.g., delay element 234 receives the phase 0° clock and delay element 240 receives the phase 0° clock. At the first delay element of each delay circuit, the input signal 114 generates an event signal in the common clock domain, e.g., the phase 0° clock domain. For example, when the input signal 114 generates event signal A(0) by delay element 234, the event signal A(0) is output in the phase 0° clock domain; delay element 238 also generates event signal B(0), in response to the input signal 114, in the phase 0° clock domain. Each delay circuit 208, 210, 212, and 214 generates a first event signal in a common clock domain. However, each delay circuit 208, 210, 212, and 214 moves or shifts the clock domain for the event signal, such that the delay elements 208, 210, 212, and 214 outputs the event signal in a different clock domain. For example, delay circuit 208 moves the event signal A(0) generated in the common phase 0° clock domain to the phase 0° clock domain. Delay circuit 210 moves the event signal D(0) generated in the common phase 0° clock domain to the phase 90° clock domain.

FPGAs are programmed and sometimes the connections between elements is not ideal. Some signals may have to travel farther than other signals in a circuit. A race condition may ensue if a first signal, which must precede a second signal, cannot reach an electrical element before the second signal. By using several delay elements in the delay circuits 204, any race conditions that are sometimes possible in FPGAs are eliminated because the delay between each delay element is at least 3 ns (assuming a 4 ns clock cycle). The 3 ns delay is long enough to preclude any possible race conditions. However, the delay between delay elements may be any duration that allows the event signal to be delayed to a predetermined phase of the clock and prevents possible race conditions. In addition, the delay between the delay elements also allow for any flip-flop setup times, hold times, and propagation delays.

In further exemplary embodiment, the triggering circuit 200 includes an output circuit 206 that is in electrical communication with each delay circuit 208, 210, 212, and 214. The output circuit 206 is in electrical communication with and can receive an event signal from any of the delay circuits 204 and output the event signal 118 from the triggering circuit 200. As such, the output circuit 206 allows for one output event signal 118 from the triggering circuit 200 regardless of the number of delay circuits 204. In the exemplary embodiment, the output circuit 206 is an OR gate.

Figure 3A:
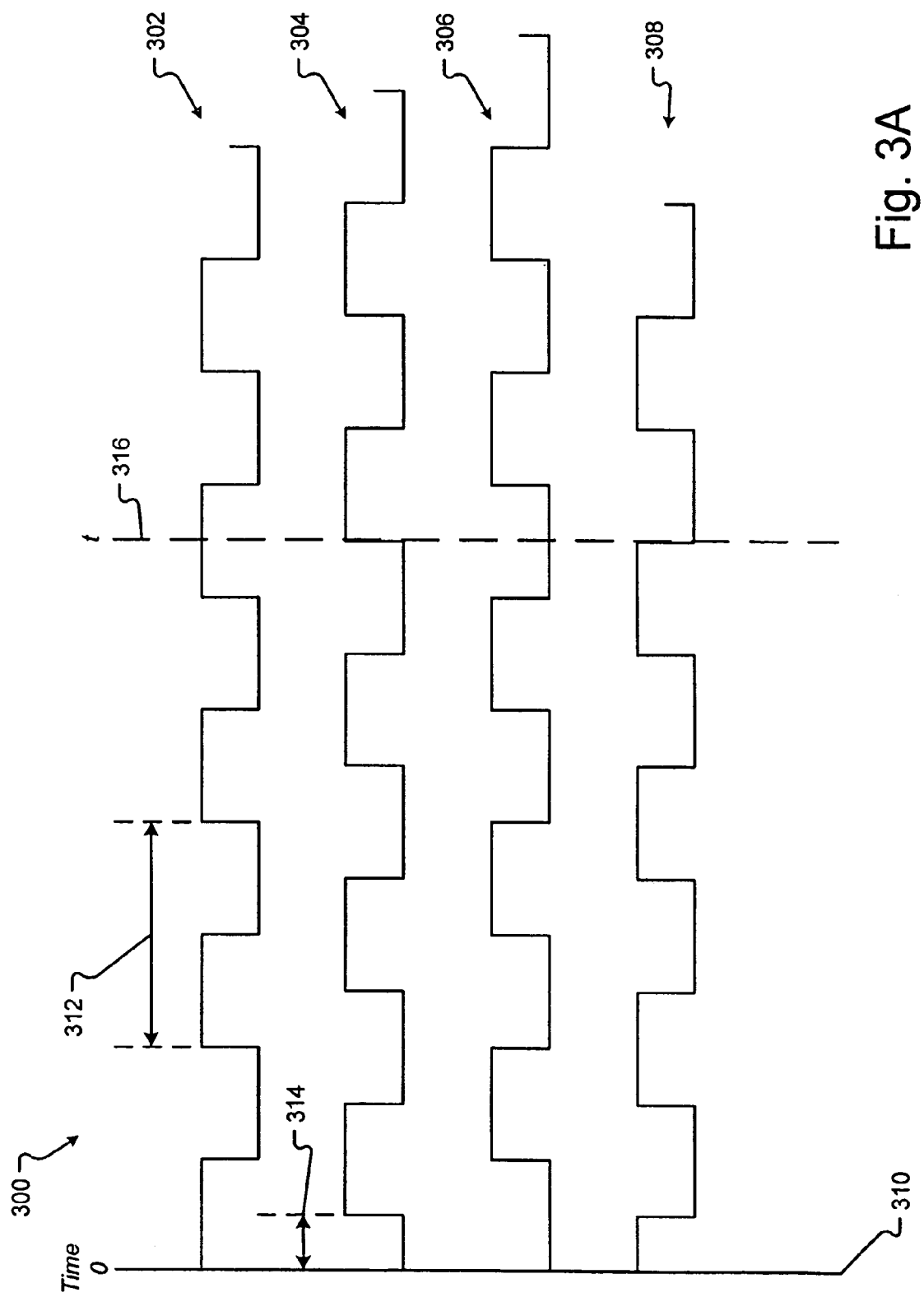

FIGS. 3A and 3B illustrate timing diagrams 300 and 318 representative of the triggering circuit 200 shown in FIG. 2. Triggering circuit 200 (FIG. 2) has four clock inputs. The phase 0° clock input is shown as clock signal 302, the phase 90° clock is clock signal 304, the phase 180° clock is clock signal 306, and the phase 270° clock is clock signal 308. Each clock has the same period represented by the distance 312. The clock period is the amount of time required for the clock to complete a clock cycle, e.g., 4 milliseconds. A clock cycle cycles through 360°. In other words, a clock may start at 0° and cycle back to its starting position in 360°. However, in timing diagrams, the clock cycle is represented by a waveform such that the clock signal starts at a certain vertical position at 0° and cycles back to the vertical position in 360°. The clock cycle is important to understanding phases.

Each clock 302, 304, 306, and 308 has a different phase. For example, the phase 0° clock has its rising edge at time 0, represented by line 310; the phase 90° clock has its rising edge one quarter of the clock cycle after the phase 0° clock, as represented by the distance 314. As such, the phase 90° clock starts at phase 90°, which is one quarter of a 360° clock cycle. Further, the phase 180° clock has its rising edge one half, or 180°, after the rising edge of the phase 0° clock, and the phase 270° clock has its rising edge three quarters, or 270°, after the rising edge of the phase 0° clock. If the clock cycle or period is 4 ns, the phase 0° clock would have its rising edge at time 0 and every 4 ns thereafter, the phase 90° clock would have its rising edge at time 1 ns every 4 ns thereafter, the phase 180° clock would have its rising edge at time 2 ms every 4 ns thereafter, and the phase 270° clock would have its rising edge at time 3 ns every 4 ns thereafter. By using the clocks having different, predetermined phases, the triggering circuit can trigger events at less than the full clock cycle, e.g., triggering circuits using clocks having four different phases and using a clock cycle of 4 ns can trigger events every 1 ns. As such, the exemplary triggering circuit 200 functionally operates four times faster than the clock cycle. For example, the triggering circuit 200 can trigger an event, represented by line 316, at time t. Rather than wait for the next rising edge of the phase 0° clock 302 (3 ns after the desired triggering time t), the triggering circuit 200 outputs an event signal after the rising edge of the phase 90° clock 304.

The timing diagram 318 in FIG. 3B, further illustrates how a triggering circuit, such as triggering circuit 200 (FIG. 2), can trigger an event at time t. In the example shown in FIG. 3B, an event is to be triggered at time t represented by line 316. As explained in conjunction with FIG. 2, an input signal 320, such as input signal 114 (FIG. 2), is received at two or more input circuits, such as input circuits 202 (FIG. 2). A phase selection signal 322, such as phase selection signal 228 (FIG. 2), is also received at one of the input circuits, such as input circuit 220 (FIG. 2). The input circuit outputs an event signal 324, in response to the input signal 320 and the phase selection signal 322, to a delay circuit, such as delay circuit 210 (FIG. 2).

The event signal 324 is received at a delay element, such as delay element 240 (FIG. 2). In addition, the first delay element receives a phase 0° clock signal 302. After the rising edge of the phase 0° clock, represented by line 310, the first delay element outputs the event signal 326, such as event signal B(0) (FIG. 2). A next delay element, such as delay element 242, receives the event signal 326 and a phase 270° clock signal 308. After the rising edge of the phase 270° clock signal, the next delay element outputs the event signal 328, such as event signal B(1) (FIG. 2). In turn, another delay element, such as delay element 246, receives the event signal 328 and a phase 180° clock signal 306, and the delay element outputs the event signal 330, such as event signal B(2) (FIG. 2). The event signal 330 is received at a final delay element, such as delay element 248. A phase 90° clock signal 304 is also received at the delay element, and, after the rising edge of the phase 90° clock, the event signal 332, such as event signal B(3) (FIG. 2), is output from the delay circuit at desired time t, represented by line 316. In further exemplary embodiments, event signal 332 is received at an output circuit, such as output circuit 206, and the event signal 334 is output from an output circuit, such as event signal 118, from the triggering circuit. The timing of any of the signals may not be exact and may occur at approximately the times shown because there may be some delays in the digital signals transitioning from their low to high states and other types of electrical phenomenon that affect the circuit. In addition, the other delay circuits function similarly and will not be explained further with reference to a timing diagram.

In order to trigger an event at some time t, an input signal and a phase selection signal must be input into an input circuit some time, represented by measurement 336, before the event is to be triggered. By appropriately inputting the input signal and the phase selection signal, an event signal may be output at a predetermined time in the future, and the event can be output at a predetermined phase of a clock, which is a fraction of the clock cycle.

Referring again to FIG. 2, the exemplary triggering circuit 200 includes four delay circuits 204. A triggering circuit may have more or fewer delay circuits. In the exemplary embodiment, the delay circuits and the delay elements in the delay circuits may form an array of the size N by M. N equals the number of delay circuits in the triggering circuit. M equals the number of delay elements in one or more delay circuits. The number of delay circuits N, in the exemplary embodiment, equals the number of phase divisions available for the clock. For example, if the clock has four phase divisions, e.g., phase 0° clock signal, phase 90° clock signal, phase 180° clock signal, etc., then the triggering circuit has four delay circuits, but, if the clock has sixteen phase divisions, e.g., phase 22.5° clock signal, phase 45° clock signal, phase 67.5° clock signal, etc., then the triggering circuit has sixteen delay circuits. While the number of delay circuits may equal the number of phase divisions for the clock, the number of delay elements M does not need to equal the number of phase divisions.

Figure 4:
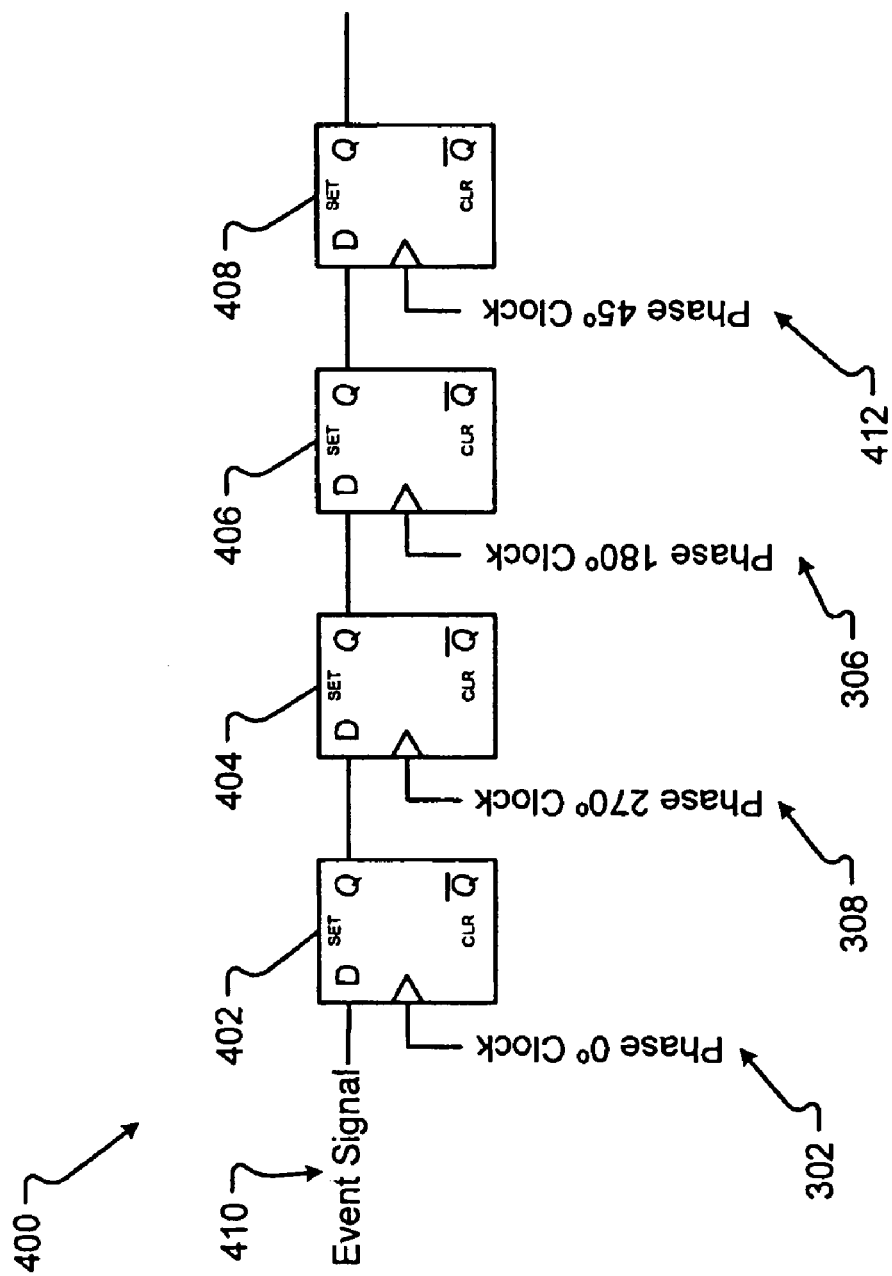
FIG. 4 is a schematic diagram of an embodiment of a delay circuit.

An exemplary delay circuit 400 for a triggering circuit using a clock with eight phase divisions is shown in FIG. 4. In the exemplary embodiment, delay circuit 400 can trigger the event at phase 45° of the clock. In the embodiment shown in FIG. 4, there are only four delay elements, 402, 404, 406, 408. The event signal 410 is input into the delay circuit 400 from an input circuit, such as input circuit 224. The first three delay elements 402, 404, and 406 operate similarly to delay elements 240, 242, and 246 for delay circuit 210 in FIG. 2. However, delay element 408 operates differently than delay element 248 (FIG. 2) because delay element 408 receives a phase 45° clock 412. Thus, delay element 408 outputs the event signal after the rising edge of the phase 45° clock. If the clock has a period of 4 ns, the event signal is output from delay element 408 2.5 ns after the event signal is output from delay element 406. The delay circuits can be configured to output event signals at any phase division of the clock while maintaining metastability and without requiring a delay element for every phase division.

Referring to triggering circuit 100 in FIG. 1, the triggering circuit 100 also can be configured to output an event signal at any phase division of the clock signal. For example, to output an event signal at any of eight phase divisions, the delay circuit 102 would require eight delay elements, such as delay elements 106 or 108. Each delay element would receive a clock having a predetermined phase equal to one of the eight phase divisions. The selection circuit 104 would be configured to select from one of the eight event signals being input into the selection circuit 104.

Figure 5:
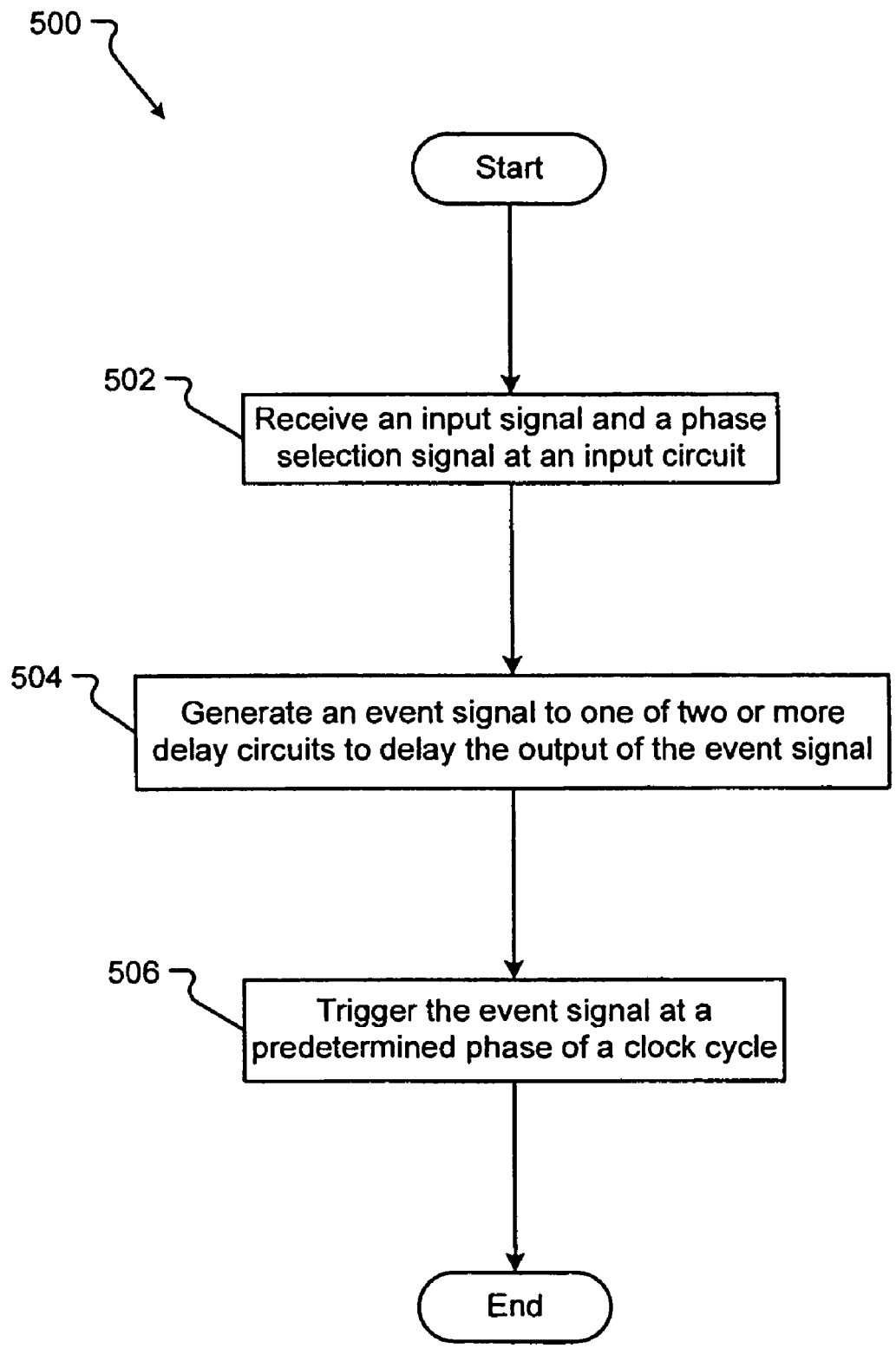
FIG. 5 shows an embodiment of a method for delaying the triggering of an event.

An exemplary method 500 for triggering an event signal, such as event signal 118 (FIG. 2), at a predetermined phase of a clock cycle is shown in FIG. 5. Receive operation 502 receives an input signal, such as input signal 114 (FIG. 2), and a phase selection signal, such as phase selection signal 226 (FIG. 2). In one exemplary embodiment, the input signal is received at two or more input circuits, such as input circuits 202 (FIG. 2), but the phase selection signal is received at only one input circuit, such as input circuit 218 (FIG. 2).

Generate operation 504 generates an event signal in response to the input signal and the phase selection signal. In the exemplary embodiment, the event signal generated by the input circuit and output to one of two or more delay circuits, such as delay circuits 204 (FIG. 2).

Trigger operation 506 then triggers the event signal at a predetermined phase of a clock cycle. In the exemplary embodiment, a delay circuit outputs the event signal at the predetermined phase and at a predetermined time. For example, delay circuit 210 (FIG. 2) outputs an event signal B(3) (FIG. 2), at a predetermined phase, e.g., at approximately the same time as the rising edge of the phase 90° clock cycle 304 (FIG. 3), at a predetermined time, e.g., 9 ns (represented by measurement 336 (FIG. 3)) after receiving the phase selection signal 322 (FIG. 3), as explained in conjunction with FIG. 3B. A delay circuit may comprise one or more delay elements, such as delay element 240 (FIG. 2). Trigger operation 506 may, in some embodiments, include outputting the event signal from one or more delay elements in a delay circuit. Each delay element in the delay circuit may receive a clock signal having a predetermined phase, such as clocks 302, 304, 306, and/or 308 (FIG. 3). The event signal is output by each of the delay elements after the rising edge of the phase of the input clock. In further exemplary embodiments, trigger operation 506 may include receiving the event signal at an output circuit, such as output circuit 118 (FIG. 2). The output circuit may be in electrical communication with two or more delay circuits in a triggering circuit. Upon receiving the event signal from one of the delay circuits, the output circuit outputs the event signal. As such, regardless of the number of delay circuits, the triggering circuit outputs only one event signal.

Figure 6:
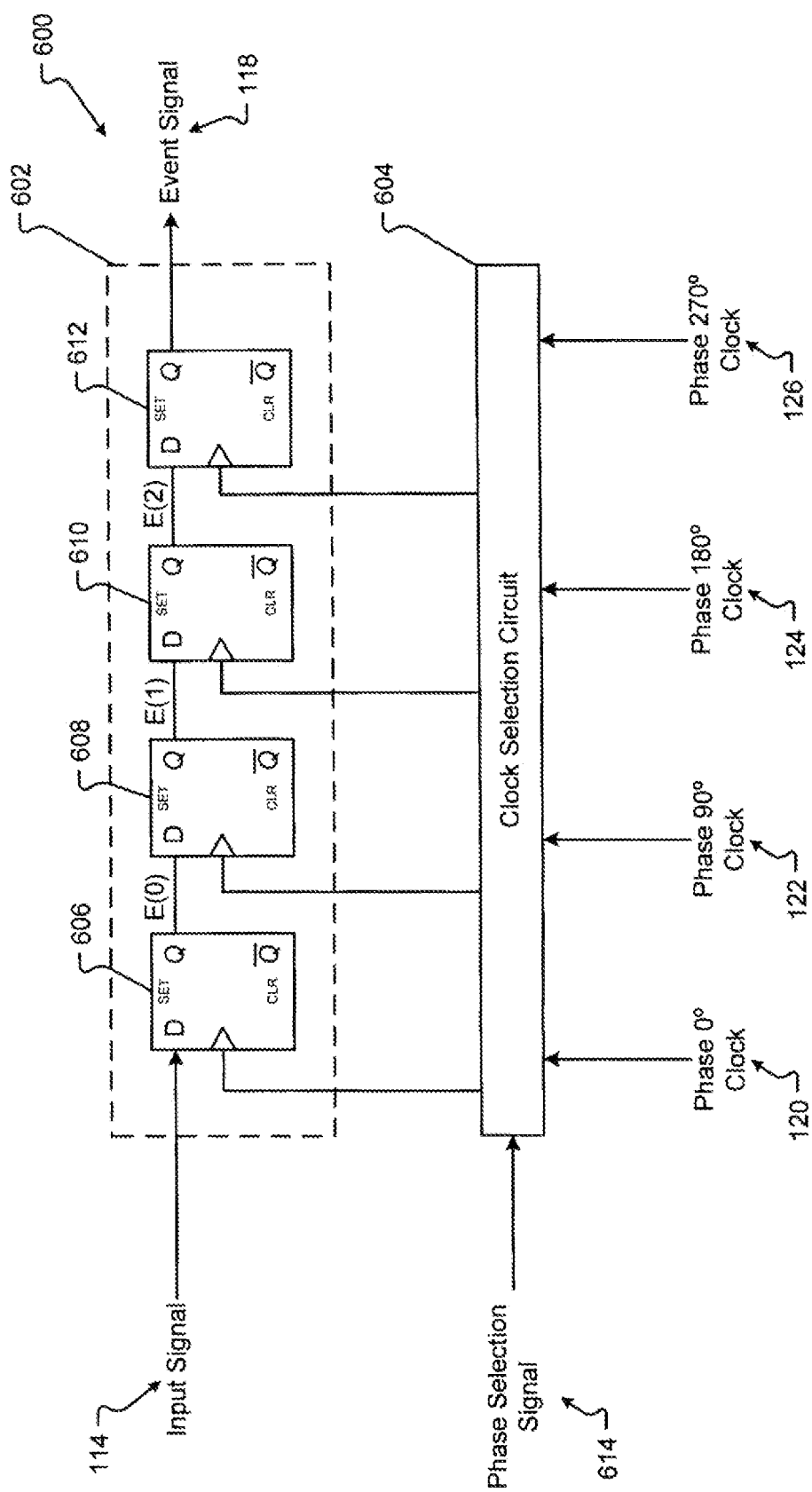
FIG. 6 is a schematic diagram of another exemplary embodiment of a digital triggering circuit.

Another exemplary embodiment of a triggering circuit 600 is shown in FIG. 6. The triggering circuit 600 comprises a delay circuit 602 and a clock selection circuit 604. The delay circuit 602 includes four delay elements 606, 608, 610, and 612. The first delay element 606 receives an input signal 114. The first delay element 606 outputs and event signal E(0) to the second delay element 608, which outputs an event signal E(1) to the third delay element 610, which outputs an event signal E(2) to a fourth delay element 612, which outputs the event signal 118. The delay circuit 602 generates a delay between the reception of the input signal 114 to the output of the event signal 118. In addition, the delay circuit 602 outputs the event signal 118 at a predetermined phase of a clock cycle.

The clock selection circuit 604 receives each clock having a different, predetermined phase 120, 122, 124, and 126. The clock selection circuit 604 is in electrical communication with each delay element 606, 608, 610, and 612 and is configured provide a clock having a predetermined phase to each delay element 606, 608, 610, and 612. In response to a phase selection signal 614, the clock selection circuit 604 outputs clocks having predetermined phases to each delay element 606, 608, 610, and 612. For example, if the phase selection signal 614 directs the event signal to be output at phase 90°, clock selection circuit 604 provides a phase 0° clock to the first delay element, a phase 270° clock to the second delay element, a phase 180° clock to the third delay element, and a phase 90° clock to the fourth delay element. This configuration of clock inputs is similar to delay circuit 210 shown in FIG. 2. Delay circuit 602 can mimic the operation of any of the delay circuits 208, 210, 212, and 214 (FIG. 2) by configuring the clock selection circuit 604 to output the same clocks having the predetermined phases input into each delay element as shown in FIG. 2.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. A triggering circuit, comprising:
   two or more input circuits, each input circuit arranged such that each input circuit receives an input signal and one of the input circuits receives a phase selection signal and outputs an event signal in response to receiving the input signal; and
   two or more delay circuits, wherein each delay circuit is in electrical communication with one of the input circuits, and wherein one delay circuit receives the event signal and is configured to trigger the event signal at a predetermined phase of a clock cycle, wherein the two or more delay circuits comprise one or more delay elements, and wherein at least one delay element triggers the event signal such that the event signal moves from one clock domain to another clock domain.

2. The triggering circuit as defined in claim 1, wherein at least one delay element is one of a flip-flop or a latch.

3. The triggering circuit as defined in claim 1, wherein at least one delay element in the delay circuit receives a clock having a predetermined phase and triggers the event signal at the predetermined phase.

4. The triggering circuit as defined in claim 3, wherein one or more other delay elements arranged such that the event signal is triggered at a predetermined time.

5. The triggering circuit as defined in claim 3, wherein at least one delay element triggers the event signal at a predetermined phase such that the event signal is triggered at a fraction of a full clock cycle.

6. The triggering circuit as defined in claim 1, wherein the two or more delay circuits forms an array of the size N by M, wherein N is a number of delay circuits and M is a number of delay elements in each delay circuit.

7. The triggering circuit as defined in claim 6, wherein the number of delay circuits N equals a number of phase divisions available for the clock cycle.

8. The triggering circuit as defined in claim 7, wherein the phase divisions are uniform.

9. The triggering circuit as defined in claim 7, wherein the phase divisions are non-uniform.

10. A triggering circuit, comprising:
    two or more input circuits, each input circuit arranged such that each input circuit receives an input signal and one of the input circuits receives a phase selection signal and outputs an event signal in response to receiving the input signal; and
    two or more delay circuits, wherein each delay circuit is in electrical communication with one of the input circuits, and wherein one delay circuit receives the event signal and is configured to trigger the event signal at a predetermined phase of a clock cycle;
    wherein at least one delay circuit, comprising two or more delay elements, moves the event signal from a first clock domain in which the event signal was generated to a second clock domain in which the event signal is output.

11. The triggering circuit as defined in claim 10, wherein there is a delay between generation of a first event signal from a first delay element and the generation of a second event signal from a second delay element.

12. The triggering circuit as defined in claim 11, wherein the delay allows for at least one of set-up times, hold-times, or propagation delays.

13. A triggering circuit, comprising:
    two or more input circuits, each input circuit arranged such that each input circuit receives an input signal and one of the input circuits receives a phase selection signal and outputs an event signal in response to receiving the input signal;
    two or more delay circuits, wherein each delay circuit is in electrical communication with one of the input circuits, and wherein one delay circuit receives the event signal and is configured to trigger the event signal at a predetermined phase of a clock cycle, thereby moving the event signal from a first clock domain having a first phase in which the event signal was generated to a second clock domain having a second phase; and
    an output circuit in electrical communication with each delay circuit such that the output circuit receives the event signal output from one of the delay circuits and outputs the event signal;
    wherein the output circuit is an OR gate.

14. A triggering circuit, comprising:
    two or more input circuits, each input circuit arranged such that each input circuit receives an input signal and one of the input circuits receives a phase selection signal and outputs an event signal in response to receiving the input signal; and
    two or more delay circuits, wherein each delay circuit is in electrical communication with one of the input circuits, and wherein one delay circuit receives the event signal and is configured to trigger the event signal at a predetermined phase of a clock cycle, thereby moving the event signal from a first clock domain having a first phase in which the event signal was generated to a second clock domain having a second phase;
    wherein at least one input circuit is an AND gate.

15. A method for triggering an event signal at a predetermined time, comprising:
    receiving an input signal at an input circuit;
    receiving a phase selection signal at the input circuit;
    generating an event signal, from the input circuit, in response to the phase selection signal and the input signal;
    receiving the event signal at a delay circuit, wherein the delay circuit comprises one or more delay elements; and
    triggering, by one of the delay elements, the event signal at a predetermined phase of a clock cycle, wherein the event signal moves from one clock domain to another clock domain.

16. The method for triggering as defined in claim 15, wherein triggering comprises:
    outputting the event signal from a delay circuit, wherein the delay circuit triggers the event signal at the predetermined phase and at a predetermined time.

17. The method for triggering as defined in claim 16, wherein outputting comprises:
    outputting the event signal from one or more delay elements in the delay circuit, wherein each delay element receives a clock having a predetermined phase, and wherein the event signal is output at the predetermined phase.

18. The method for triggering as defined in claim 15, wherein the input signal is received at two or more input circuits, wherein the phase selection signal is received at one input circuit, and triggering comprises outputting the event signal from the input circuit that received the phase selection signal.

19. The method for triggering as defined in claim 15, wherein triggering comprises:
    receiving the event signal at an output circuit in electrical communication with two or more delay circuits; and
    outputting the event signal from the output circuit.

* * * * *